United States Patent
Snir et al.

(10) Patent No.: US 11,277,902 B2
(45) Date of Patent: Mar. 15, 2022

(54) SINGLE LAYER RADIO FREQUENCY INTEGRATED CIRCUIT PACKAGE AND RELATED LOW LOSS GROUNDED COPLANAR TRANSMISSION LINE

(71) Applicant: Arbe Robotics Ltd., Tel Aviv (IL)

(72) Inventors: Nadav Snir, Tel Aviv (IL); Konstantin Trotskovsky, Rehovot (IL); Assaf Stav, Givatayim (IL)

(73) Assignee: Arbe Robotics Ltd.

( * ) Notice: Subject to any disclaimer, the term of this patent is extended or adjusted under 35 U.S.C. 154(b) by 0 days.

(21) Appl. No.: 17/301,762

(22) Filed: Apr. 13, 2021

(65) Prior Publication Data

US 2021/0368615 A1 Nov. 25, 2021

Related U.S. Application Data

(60) Provisional application No. 63/029,570, filed on May 25, 2020.

(51) Int. Cl.
*H05K 1/02* (2006.01)
*H01Q 9/04* (2006.01)
(Continued)

(52) U.S. Cl.
CPC ....... *H05K 1/0216* (2013.01); *H01L 23/3128* (2013.01); *H01L 23/49838* (2013.01);
(Continued)

(58) Field of Classification Search
CPC .......... H01P 3/006; H01L 24/26; H01L 23/66; H01L 23/4983; H01L 23/3128; H05K 1/0216
(Continued)

(56) References Cited

U.S. PATENT DOCUMENTS

2013/0257670 A1* 10/2013 Sovero ............... H01Q 1/24
343/833
2014/0211438 A1* 7/2014 Lin ................... H01L 24/11
361/767

(Continued)

*Primary Examiner* — Tremesha S Willis
(74) *Attorney, Agent, or Firm* — Zaretsky Group PC; Howard Zaretsky

(57) ABSTRACT

A novel and useful a single layer RFIC/MMIC structure including a package and related redistribution layer (RDL) based low loss grounded coplanar transmission line. The structure includes a package molded around an RF circuit die with a single redistribution layer (RDL) fabricated on the surface thereof mounted on an RF printed circuit board (PCB) via a plurality of solder balls. Coplanar transmission lines are fabricated on the RDL to conduct RF output signals from the die to PCB signal solder balls. The signal trace transition to the solder balls are funnel shaped to minimize insertion loss and maximize RF isolation between channels. A conductive ground shield is fabricated on the single RDL and operative to shield the plurality of coplanar transmission lines. The ground shield is electrically connected to a ground plane on the PCB via a plurality of ground solder balls arranged to surround the plurality of coplanar RF transmission lines and signal solder balls, and are operative to couple the ground shield to the ground plane on the PCB and provide an electrical return path for the plurality of coplanar transmission lines. Ground vias on the printed circuit board can be either located under the ground solder balls or between them.

22 Claims, 13 Drawing Sheets

(51) Int. Cl.
*H05K 1/11* (2006.01)
*H01L 23/31* (2006.01)
*H01L 23/498* (2006.01)
*H01L 23/66* (2006.01)
*H01L 23/00* (2006.01)
*H01P 3/00* (2006.01)

(52) U.S. Cl.
CPC .............. *H01L 23/66* (2013.01); *H01L 24/16* (2013.01); *H01P 3/006* (2013.01); *H01Q 9/0407* (2013.01); *H05K 1/0243* (2013.01); *H05K 1/115* (2013.01); *H01L 2223/6622* (2013.01); *H01L 2223/6627* (2013.01); *H01L 2223/6677* (2013.01); *H01L 2224/16227* (2013.01); *H01L 2924/19033* (2013.01); *H01L 2924/30111* (2013.01); *H05K 2201/10734* (2013.01)

(58) Field of Classification Search
USPC ........................................................ 361/783
See application file for complete search history.

(56) References Cited

U.S. PATENT DOCUMENTS

2014/0320231 A1* 10/2014 Seler ..................... H01L 24/19
333/26
2018/0350751 A1* 12/2018 Sun ..................... H05K 1/0216
2020/0176393 A1* 6/2020 Ketterson ............... H01L 23/66
2020/0388578 A1* 12/2020 Lim ..................... H05K 1/0222

* cited by examiner

SINGLE LAYER RADIO FREQUENCY INTEGRATED CIRCUIT PACKAGE AND RELATED LOW LOSS GROUNDED COPLANAR TRANSMISSION LINE

REFERENCE TO PRIORITY APPLICATION

This application claims priority to U.S. Provisional Application Ser. No. 63/029,570, filed May 25, 2020, entitled "Single Layer Integrated Circuit Package And Related Low Loss Coplanar Transmission Line," incorporated herein by reference in its entirety.

FIELD OF THE DISCLOSURE

The subject matter disclosed herein relates to the field of integrated circuit (IC) packaging and more particularly relates to a single layer radio frequency (RFIC) or monolithic microwave integrated circuit (MMIC) package and related low loss grounded coplanar transmission line.

BACKGROUND OF THE INVENTION

In recent years many industries are moving to autonomous solutions such as the automotive industry, deliveries etc. These autonomous platforms should operate in the environment while interacting with both the stationary and moving objects. For this purpose, these systems require a sensor suite which allows them to sense their surrounding in a reliable and efficient manner. For example, in order for an autonomous car to plan its route on a road with other cars on it, the trajectory planner must have a 3D map of the environment with indication of moving objects.

Visual sensors are also degraded by bad weather and poor visibility due to fog, smoke, sand, storms, etc.). They are also limited in estimating radial velocities. Light Detection And Ranging (LIDAR) devices are used to measure distance to a target by illuminating that target with a laser light. These devices, however, are expensive, have moving parts, and have very limited range.

Recently, applications of radars in the automotive industry have started to emerge. High-end automobiles already have radars that provide parking assistance and lane departure warning to the driver. Currently, there is growing interest in self-driving cars and it is currently considered to be the main driving force in the automotive industry in the coming years.

Self-driving cars offer a new perspective on the application of radar technology in automobiles. Instead of only assisting the driver, automotive radars will be capable of taking an active role in the control of the vehicle. They are thus likely to become a key sensor of the autonomous control system of a vehicle.

Radar is preferred over other alternatives such as sonar or LIDAR as it is less affected by weather conditions and can be made very small to decrease the effect of the deployed sensor on the aerodynamics and appearance of the vehicle. Frequency Modulated Continuous Wave (FMCW) radar is a type of radar that offers several advantages compared to the others. For example, it ensures the range and velocity information of the surrounded objects can be detected simultaneously. This information is important for the control system of the self-driving vehicle to provide safe and collision-free operation.

Currently, vehicles (especially cars) are increasingly equipped with technologies designed to assist the driver in critical situations. Besides cameras and ultrasonic sensors, car manufacturers are turning to radar as the cost of the associated technology decreases. The attraction of radar is that it provides fast and clear-cut measurement of the velocity and distance of multiple objects under any weather conditions. The relevant radar signals are frequency modulated and can be analyzed with spectrum analyzers. In this manner, developers of radar components can automatically detect, measure and display the signals in time and frequency domains, even up to frequencies of 500 GHz.

There is also much interest now in using radar in the realm of autonomous vehicles which is expected to become more prevalent in the future. Millimeter wave automotive radar is suitable for use in the prevention of collisions and for autonomous driving. Millimeter wave frequencies from 77 to 81 GHz are less susceptible to the interference of rain, fog, snow and other weather factors, dust and noise than ultrasonic radars and laser radars. These automotive radar systems typically comprise a high frequency radar transmitter which transmits a radar signal in a known direction. The transmitter may transmit the radar signal in either a continuous or pulse mode. These systems also include a receiver connected to the appropriate antenna system which receives echoes or reflections from the transmitted radar signal. Each such reflection or echo represents an object illuminated by the transmitted radar signal.

Advanced driver assistance systems (ADAS) are systems developed to automate, adapt, and enhance vehicle systems for safety and better driving. Safety features are designed to avoid collisions and accidents by offering technologies that alert the driver to potential problems, or to avoid collisions by implementing safeguards and taking over control of the vehicle. Adaptive features may automate lighting, provide adaptive cruise control, automate braking, incorporate GPS/traffic warnings, connect to smartphones, alert driver to other cars or dangers, keep the driver in the correct lane, or show what is in blind spots.

Systems such as radar are demanding increasingly smaller integrated circuits, including radio frequency (RF) circuits. The performance of high frequency RF circuits in general and RFICs and MMICs in particular is sensitive to the coupling of electromagnetic energy into nearby structures. In addition, in systems such as radar, as the frequency of operation increases, it is increasingly difficult to route transmit and receive signals between RFIC chips and antennas. This is especially the case for radars operating at 80 GHz. As integrated circuit package and module sizes decrease, nearby metal features in the package or assemblies nearby can couple to the RF circuits and effect their performance. Such coupling is becoming more and more of a problem especially for RF frequencies of 80 GHz.

There is thus a need for an IC package that is relatively low cost, less complex to manufacture, achieves high performance, and is operative at automotive radar frequencies of 80 GHz.

SUMMARY OF THE INVENTION

The present invention is a single layer RFIC (and MMIC) package and related redistribution layer (RDL) based low loss grounded coplanar transmission line suitable for use in RF and microwave applications such as those designed for automotive radar systems using the 77-81 GHz band. Note that references to RFIC alone are intended to refer to both RFIC and MMIC chips and applications.

One application of the RFIC package of the present invention is in millimeter wave wireless communication systems and in particular, automotive radar systems. A vehicle or automotive radar is typically mounted on an outer surface of the target vehicle and functions to detect and track distance, speed, and angle of targets. Typically frequency modulated continuous wave (FMCW) radar is implemented using the 77-81 GHz band. Typically, the radar system employs transmit and receive patch antenna arrays configured to illuminate as wide a field of view as possible.

In one embodiment, the RFIC structure, comprises an integrated circuit die (Si, SiGe, GaAs, etc.) incorporating radio frequency (RF) circuitry and a plurality of RF output signals. A package is molded around and encapsulates the integrated circuit die. A single redistribution layer is fabricated on the surface of the package which is mounted on and electrically coupled to an RF printed circuit board via a plurality of solder ball transitions in a ball grid array. A plurality of coplanar RF transmission lines are fabricated on the single redistribution layer are operative to conduct the RF output signals from the integrated circuit die to a first side of the printed circuit board via signal solder ball transitions.

A conductive ground shield is fabricated on the single redistribution layer and operative to shield the plurality of coplanar RF transmission lines where the ground shield is electrically connected to a ground plane on the printed circuit board via a plurality of ground solder balls. The plurality of ground solder balls are arranged to surround the plurality of coplanar RF transmission lines and signal solder ball transitions, and are operative to couple the ground shield to the ground plane on the printed circuit board and provide an electrical return path for the plurality of coplanar RF transmission lines. In one embodiment, ground vias on the printed circuit board are located under all the ground solder balls. In another embodiment, no ground vias on the printed circuit board are located under the ground solder balls. Rather, they are located between the ground solder balls and not under them.

There is thus provided in accordance with the invention, a radio frequency integrated circuit (RFIC) structure, comprising an integrated circuit die incorporating radio frequency (RF) circuitry and a plurality of RF output signals, a package molded around and encapsulating said integrated circuit die, a single redistribution layer fabricated on a surface of said package, said integrated circuit die electrically coupled to said single redistribution layer, said redistribution layer operative to be mounted on and electrically coupled to a printed circuit board via a plurality of solder ball transitions in a ball grid array, a plurality of coplanar RF transmission lines fabricated on said single redistribution layer operative to conduct said plurality of RF output signals from said integrated circuit die to a first side of said printed circuit board via signal solder ball transitions, wherein each coplanar RF transmission line comprises a funnel shape portion leading to a respective signal solder ball, a conductive ground shield fabricated on said single redistribution layer and operative to shield said plurality of coplanar RF transmission lines, said ground shield electrically connected to a ground plane on said printed circuit board via a plurality of ground solder balls, and wherein said plurality of ground solder balls surround said plurality of coplanar RF transmission lines and said signal solder ball transitions, and are operative to couple said ground shield to said ground plane on said printed circuit board and provide an electrical return path for said plurality of coplanar RF transmission lines.

There is also provided in accordance with the invention, a radio frequency integrated circuit (RFIC) structure, comprising an integrated circuit die incorporating radio frequency (RF) circuitry and a plurality of RF output signals, a package molded around and encapsulating said integrated circuit die, a single redistribution layer fabricated on a surface of said package, said integrated circuit die electrically coupled to said single redistribution layer, said redistribution layer operative to be mounted on and electrically coupled to a printed circuit board via a plurality of solder ball transitions in a ball grid array, a plurality of coplanar RF transmission lines fabricated on said single redistribution layer operative to conduct said plurality of RF output signals from said integrated circuit die to a first side of said printed circuit board via signal solder ball transitions, a conductive ground shield fabricated on said single redistribution layer and operative to shield said plurality of coplanar RF transmission lines, said ground shield electrically connected to a ground plane on said printed circuit board via a plurality of ground solder balls, wherein said plurality of ground solder balls surround said plurality of coplanar RF transmission lines and said signal solder ball transitions, and are operative to couple said ground shield to said ground plane on said printed circuit board and provide an electrical return path for said plurality of coplanar RF transmission line, a plurality of grounded coplanar transmission lines fabricated on a first side of said printed circuit board electrically connecting said RF output signals from said signal solder ball transitions to patch antennas fabricated on a second side of said printed circuit board, and a plurality of ground vias electrically connecting a ground return plane on said first side of said printed circuit board to a ground reference plane on said second side of said printed circuit board including under said ground solder balls.

There is further provided in accordance with the invention, a radio frequency integrated circuit (RFIC) structure, comprising an integrated circuit die incorporating radio frequency (RF) circuitry and a plurality of RF output signals, a package molded around and encapsulating said integrated circuit die, a single redistribution layer fabricated on a surface of said package, said integrated circuit die electrically coupled to said single redistribution layer, said redistribution layer operative to be mounted on and electrically coupled to a printed circuit board via a plurality of solder ball transitions in a ball grid array, a plurality of coplanar RF transmission lines fabricated on said single redistribution layer operative to conduct said plurality of RF output signals from said integrated circuit die to a first side of said printed circuit board via signal solder ball transitions, a conductive ground shield fabricated on said single redistribution layer and operative to shield said plurality of coplanar RF transmission lines, said ground shield electrically connected to a ground plane on said printed circuit board via a plurality of ground solder balls, wherein said plurality of ground solder balls surround said plurality of coplanar RF transmission lines and said signal solder ball transitions, and are operative to couple said ground shield to said ground plane on said printed circuit board and provide an electrical return path for said plurality of coplanar RF transmission line, a plurality of grounded coplanar transmission lines fabricated on a first side of said printed circuit board electrically connecting said RF output signals from said signal solder ball transitions to patch antennas fabricated on a second side of said printed circuit board, and a plurality of ground vias electrically connecting a ground return plane on said first side of said printed circuit board to a ground reference plane on said second side of said printed circuit board including surrounding said signal solder ball transitions but not under said ground solder balls.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1:
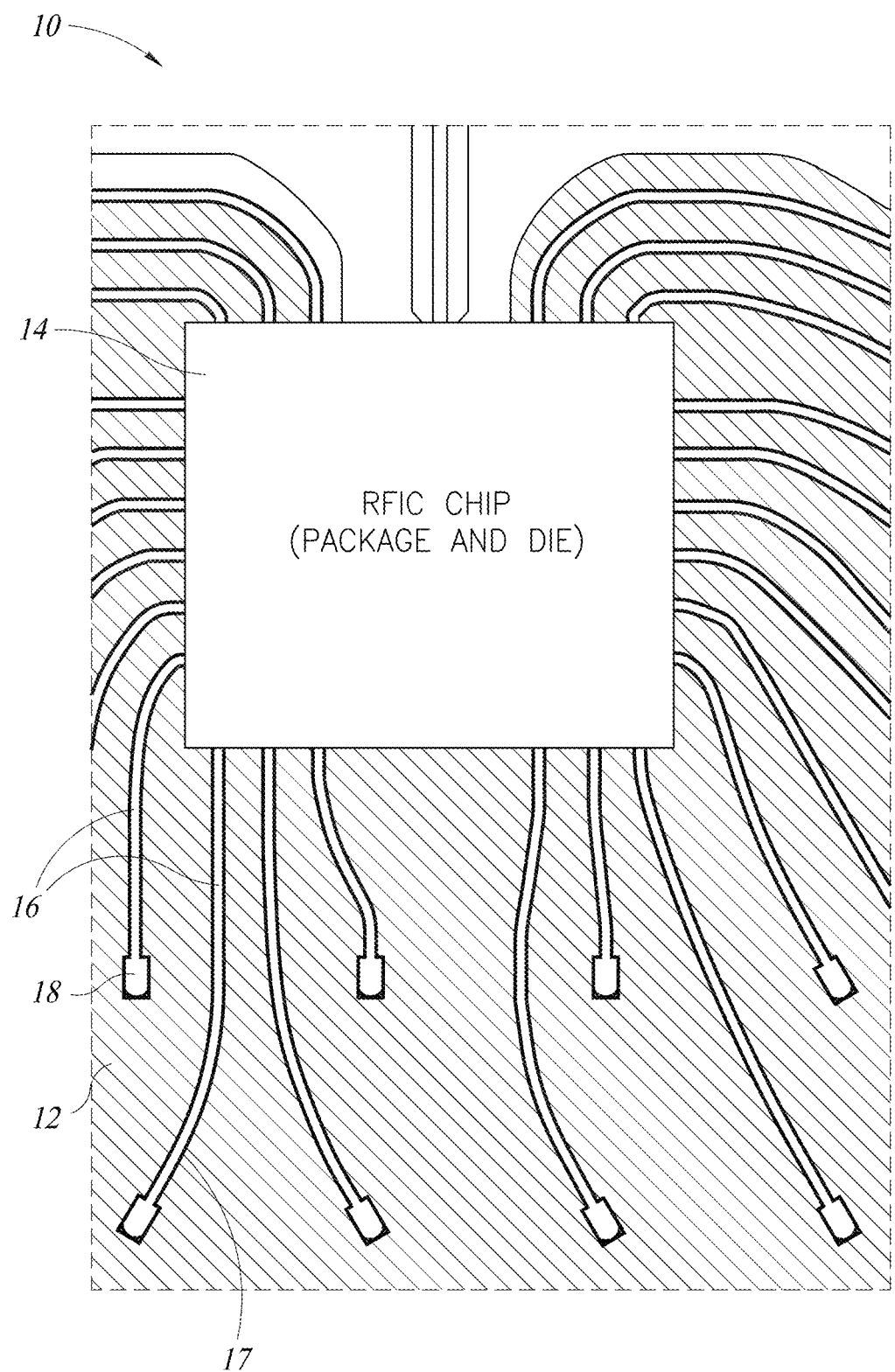
FIG. 1 is a diagram illustrating a radio frequency integrated circuit (RFIC) and a portion of a printed circuit board (PCB) incorporating grounded coplanar transmission lines.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein. It is to be understood, however, that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

A diagram illustrating a radio frequency integrated circuit (RFIC) and a portion of a printed circuit board (PCB) incorporating grounded coplanar transmission lines is shown in FIG. 1. The structure, generally referenced 10, comprises a RFIC chip 14 comprising a die and package, such as a ball grid array (BGA), mounted on a printed circuit board (PCB). The multilayer PCB includes at least top, bottom, and one or more middle layers. In the examples shown herein, the RFIC is either a transmitter (TX) chip or receiver (RX) chip for a radar system operating at 80 GHz. In one embodiment, the signal lines 16 from the RFIC to the antennas comprise grounded coplanar transmission lines. The signal transmission lines 16 are surrounded by a solid or mesh ground return 12 and separated by air gap 17. Each signal transmission line transitions through the PCB to the other side by vias 18 (under the top copper layer and typically filled). In this example embodiment, the RFIC 14 is a TX chip operative to generate 24 TX signals.

Figure 2:
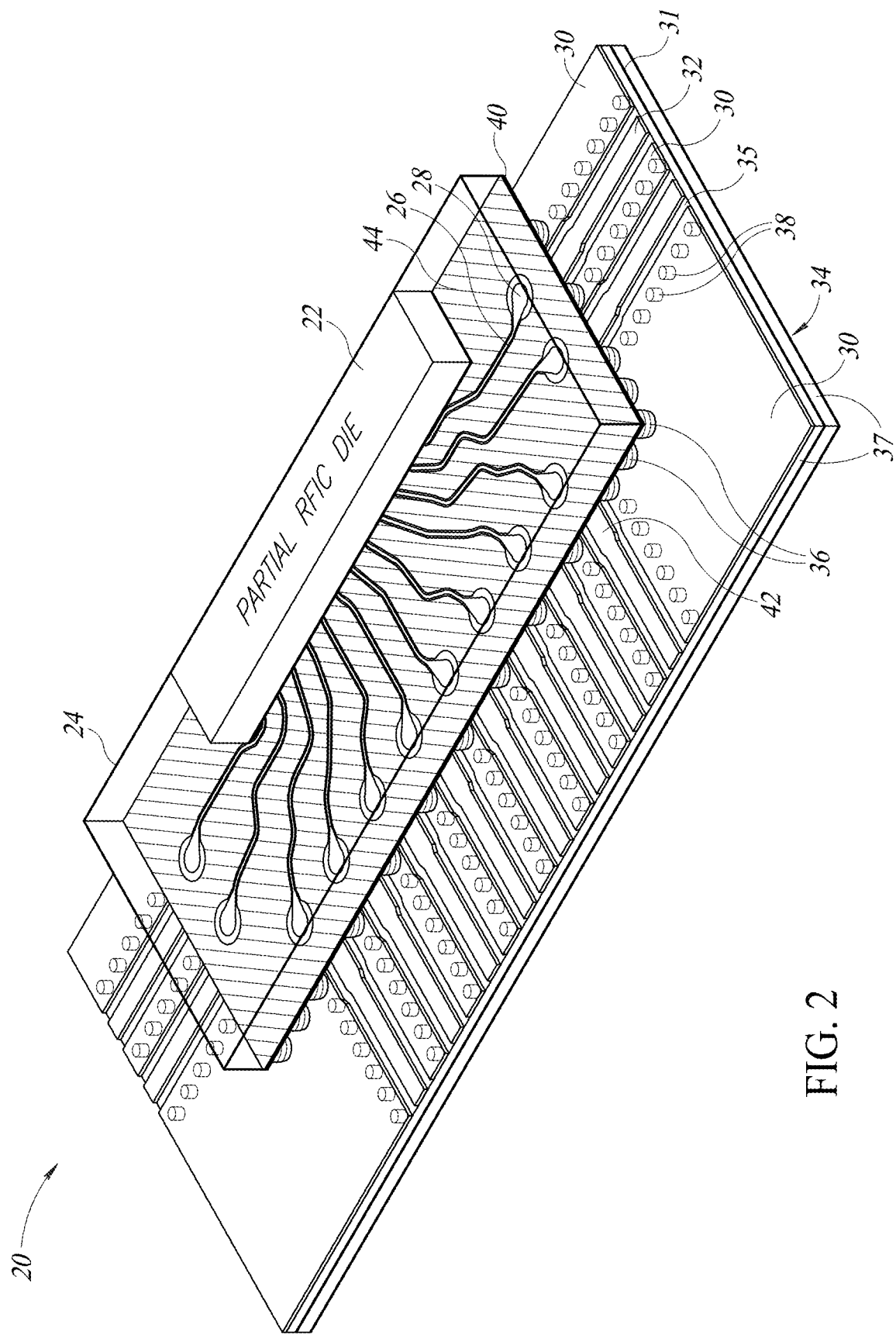
FIG. 2 is a diagram illustrating an example RFIC chip including package and redistribution layer and PCB incorporating grounded coplanar transmission lines.

A diagram illustrating an example RFIC chip including package and redistribution layer and PCB incorporating grounded coplanar transmission lines is shown in FIG. 2. The RFIC structure, generally referenced 20, comprises a chip, that includes die 22 molded in package 24, soldered to printed circuit board 34 via a ball grid array (BGA) 36. The signal lines 26 connect the high frequency output signals from the die 22 (TX for example) to signal solder balls 36 to the printed circuit board 34 at transitions 28. The signals travel along coplanar transmission lines 26 that are part of a redistribution layer (RDL) 40 fabricated on the bottom surface of the package 24. A solid or mesh ground return 44 surrounds each signal trace 26 and covers most of the surface of the package. The package provides fan out of the signals and facilitates connections of the signal lines to the printed circuit board. In one embodiment, the RDL comprises copper layer approximately 12 μm thick over a dielectric layer approximately 11.5 μm thick.

The signal solder balls are soldered to the printed circuit board at one end of grounded coplanar transmission lines 32 that extend from the signal solder balls to coaxial vias connected to patch antennas printed on the other side of the printed circuit board. Each grounded coplanar transmission line 32 includes an impedance matching distributed transformer 42. Note that without the transformer there would be an impedance mismatch between the RDL in the package and the printed circuit board. In addition, each signal line 32 is surrounded by a solid or mesh ground return 30 separated by an air gap 35. A plurality of ground vias 38 couple the ground return areas 30 to an inner ground plane layer 31. The printed circuit board 34 comprises a plurality of dielectric layers 37 depending on the number of layers required. Note that in this example embodiment, ground vias 38 are located under all ground solder balls that electrically connect the ground return 44 on the redistribution layer 40 of the package 24 to the ground return 30 on the printed circuit board. The ground vias electrical connect the ground return 30 to a ground plane on, for example, a second layer of the printed circuit board 34.

Figure 3:
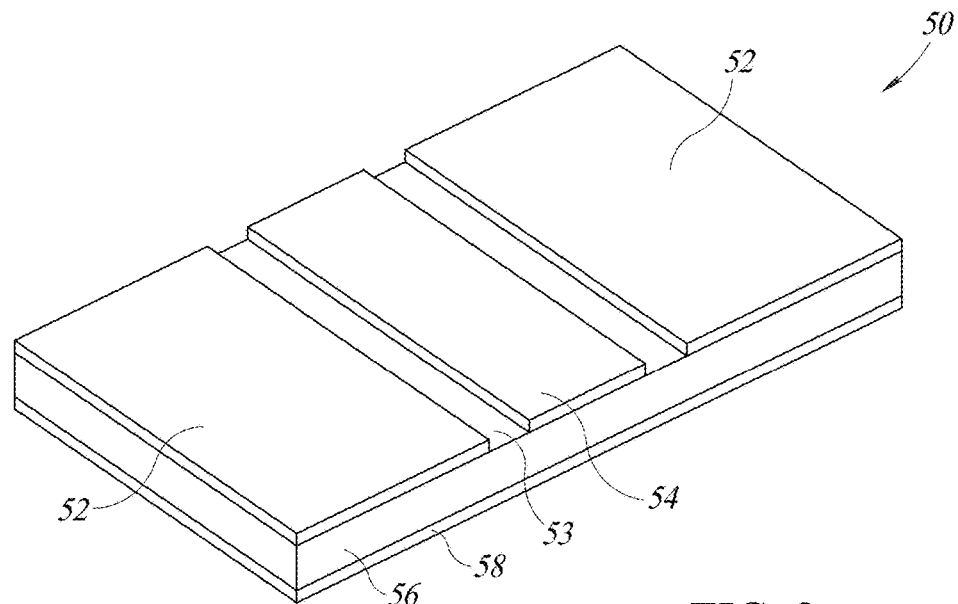
FIG. 3 is a diagram illustrating an example grounded coplanar transmission line.

A diagram illustrating an example grounded coplanar transmission line is shown in FIG. 3. The transmission line, generally referenced 50, comprises conductor 54, ground return 52, dielectric layer 56, and ground plane 58. Coplanar waveguide is a type of electrical planar transmission line which is fabricated using printed circuit board technology, and is used to convey microwave-frequency signals. On a smaller scale, coplanar waveguide transmission lines are also built into monolithic microwave integrated circuits.

Conventional coplanar transmission line comprises a single conducting track 54 printed onto a dielectric substrate 56, together with a pair of return conductors 52, one to either side of the track. All three conductors are on the same side of the substrate, and hence are coplanar. The return conductors are separated from the central track by a small gap 53, which has an unvarying width along the length of the line. Away from the central conductor, the return conductors usually extend to an indefinite but large distance, so that each is notionally a semi-infinite plane. A ground plane 58 covers the entire backface of the substrate or dielectric 56. The ground plane serves as a third return conductor.

The electromagnetic wave carried by a coplanar waveguide exists partly in the dielectric substrate, and partly in the air above it. In general, the dielectric constant of the substrate will be different (and greater) than that of the air, so that the wave is travelling in an inhomogeneous medium.

Figure 4:
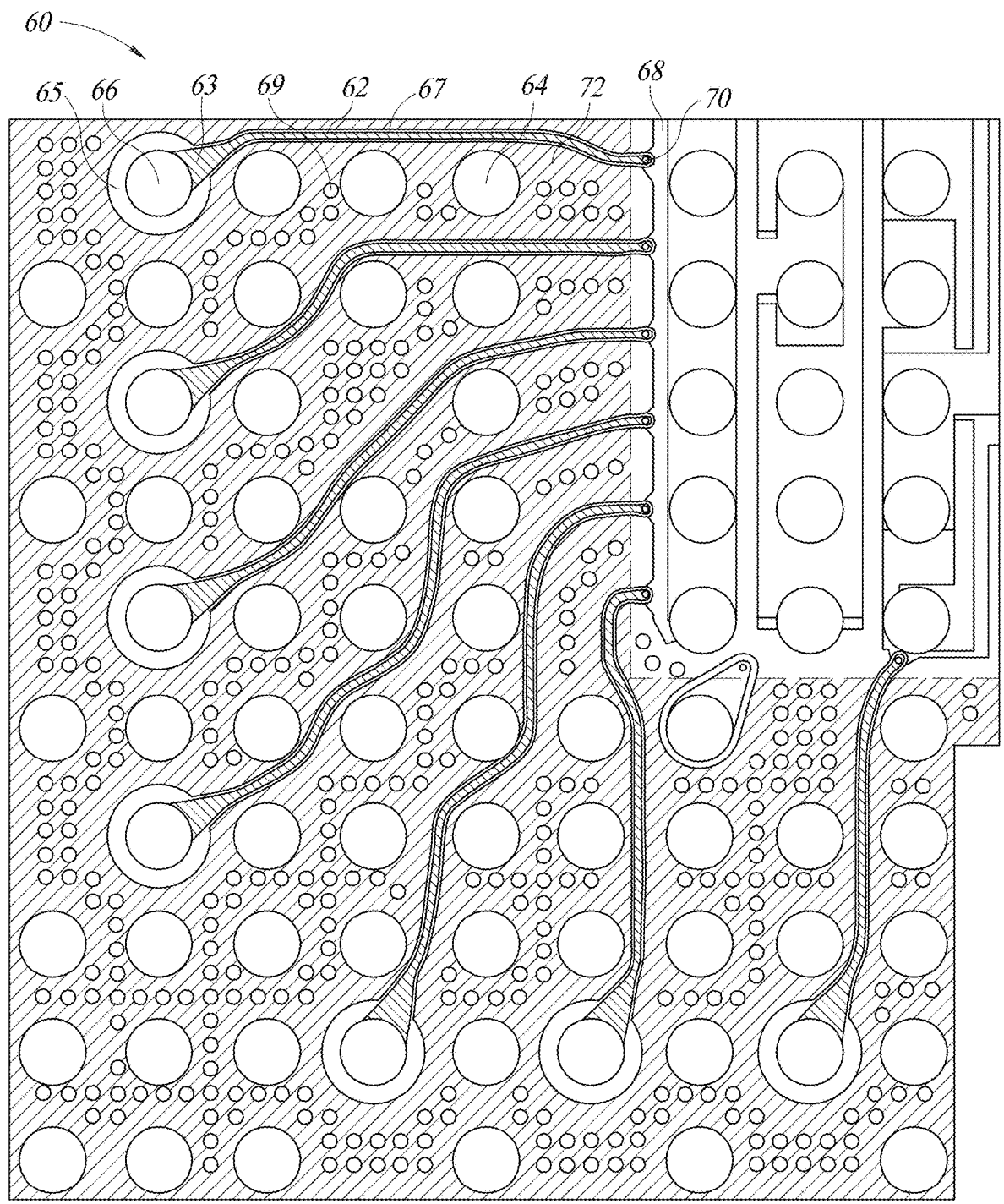
FIG. 4 is a diagram illustrating an example redistribution layer fabricated on the surface of a package.

A diagram illustrating an example redistribution layer fabricated on the surface of a package is shown in FIG. 4. The redistribution layer (RDL), generally referenced 60, comprises coplanar transmission lines from signal vias 70 connecting circuit connections on the die 68 to signal solder balls 66. The coplanar transmission lines comprise signal conductors (i.e. paths) 62 surrounded by a solid or mesh ground plane 72 separated by air gap 67 along the signal path and air gap 65 around signal solder balls 66. A plurality of ground solder balls 64 electrically connect the ground plane 72 on the RDL to the ground return top layer 30 (FIG. 2) of the PCB. The RDL also includes solder balls for connections other than high frequency input or output signals and ground, such as data and control lines, etc.

It is noted that the shape of the ground plane 72 around the signal path 62 plays a significant role in achieving the performance required from the chip, package, and PC board the chip is mounted on. In one embodiment, the signal trace 62 is connected to the solder ball 66 via a funnel shaped trace 63 which functions to create a gradual impedance change between the transmission line or path 62 and the solder ball 66. Both the gradual expansion of the signal trace (i.e. widening towards the solder ball) and the ground plane situated on both sides of the funnel 63 are appropriately designed to have optimal RF matching and minimum insertion loss properties. In addition, use of the funnel shape trace maximizes the RF isolation between channels.

Note further that in one embodiment, the signal solder balls 66 are surrounded by the ground plane from all sides (i.e. 360 degrees). The surrounding metal ground plane 72 on the RDL between the ground solder balls 64 functions to enhance the isolation between adjacent RF signal channels. The ground plane that surrounds the signal solder ball is designed with an air gap 65 having a diameter and distance from the signal solder ball that is optimal for confining the electromagnetic field such that minimal electromagnetic radiation leaks to other signal channels.

Figure 5:
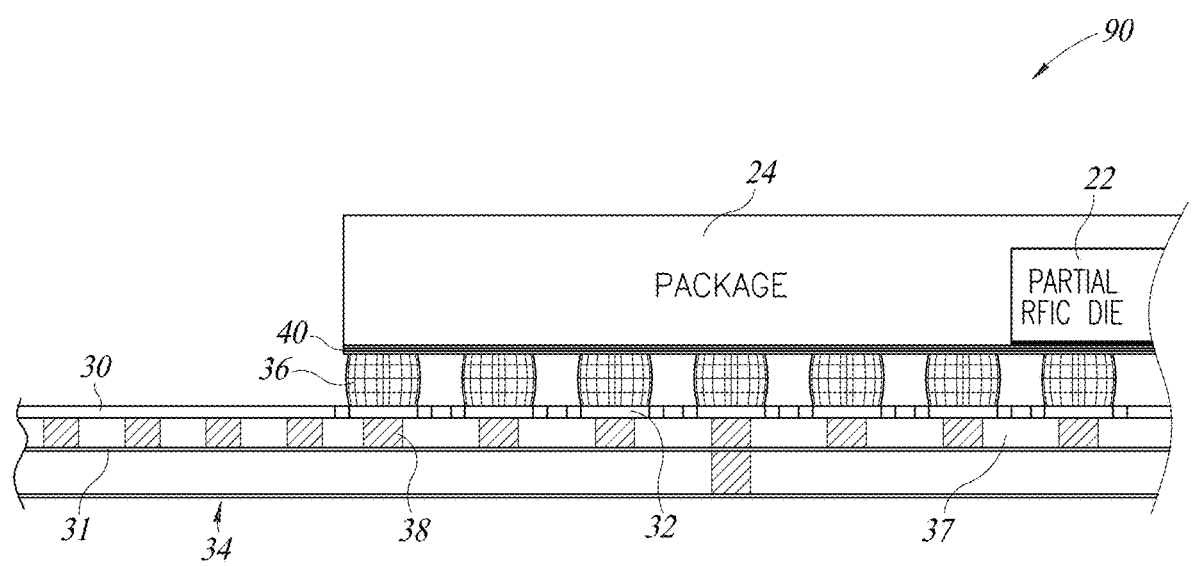
FIG. 5 is a cross sectional diagram illustrating an example RFIC chip including die, package, and redistribution layer with ball grid array and PCB incorporating ground vias.

A cross sectional diagram illustrating an example RFIC chip including die, package, and redistribute on layer with ball grid array and PCB incorporating ground vias is shown in FIG. 5. The RFIC structure, generally referenced 90, comprises RFIC die 22, package 24, redistribution layer 40, signal and ground solder balls 36, printed circuit board 34, grounded coplanar transmission lines including conductors 32, ground return 30, and ground plane 31, and a plurality of ground vias 38 electrically connecting ground solder balls and ground return 30 to the ground plane 31 (for example layer 2 of the PCB). A ground via 38 is located under each ground solder ball 36.

Figure 6:
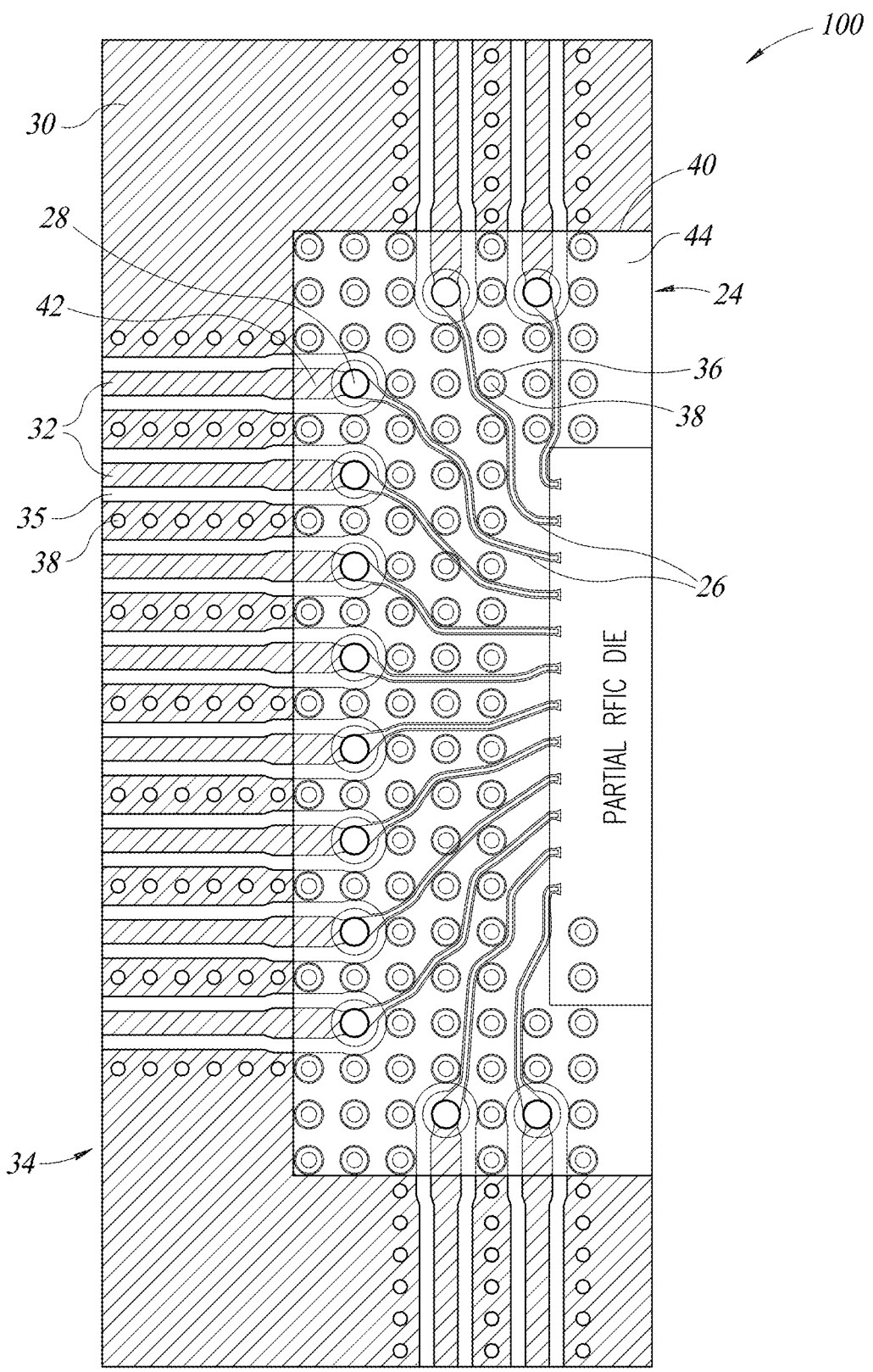
FIG. 6 is a top view diagram illustrating an example package and redistribution layer with ball grid array and PCB incorporating grounded coplanar transmission lines and ground vias.

A top view diagram illustrating an example package and redistribution layer with ball grid array and PCB incorporating grounded coplanar transmission lines and ground vias is shown in FIG. 6. The RFIC structure, generally referenced 100, comprises RFIC die 22, package 24 molded to encapsulate the die 22, redistribution layer 40, ball grid array 36, and printed circuit board 34. The redistribution layer 40 comprises coplanar transmission lines including signal conductors 26 and ground return 44. The printed circuit board 34 comprises grounded coplanar transmission lines including signal conductors 32 separated by an air gap 35 from ground return 30, a plurality of ground vias 38 including under the ground solder balls, and a plurality of dielectric layers 37. The signal conductors 32 also comprise impedance matching transformers 42 and are electrically connected to the redistribution layer via signal solder ball transitions 28. The ground solder balls electrically connect the ground return 44 on the redistribution layer to the ground return 30 on the printed circuit board. The ground vias 38 electrically the ground return 30 to a ground plane on an inner layer (not shown).

Figure 7:
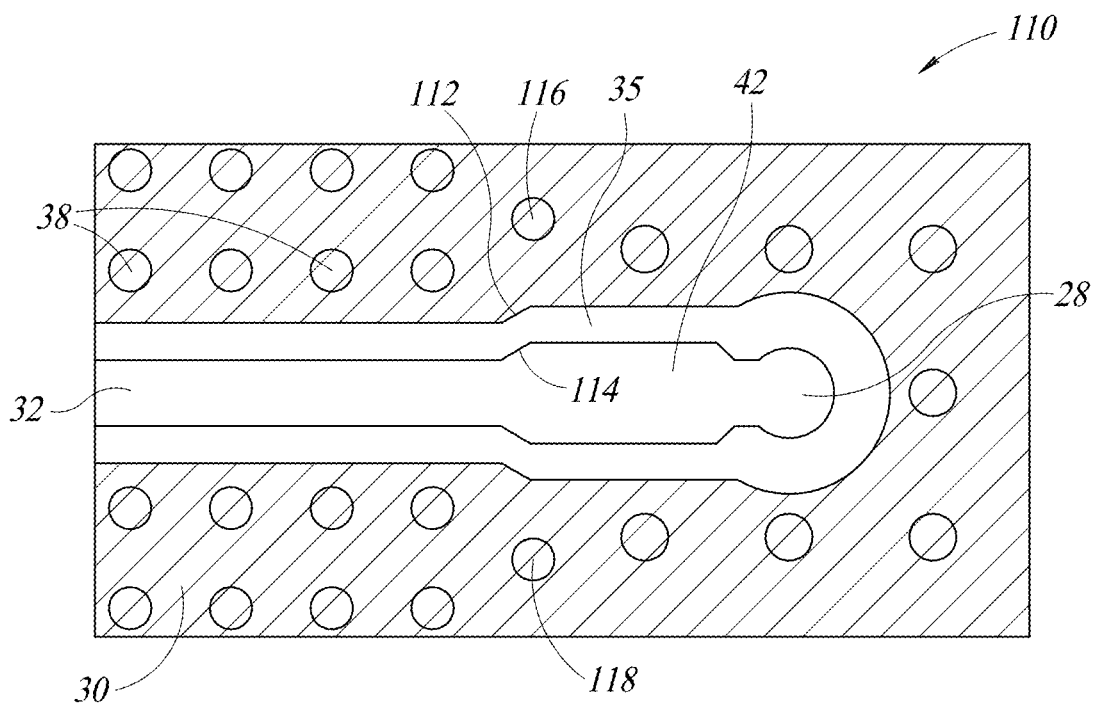
FIG. 7 is a diagram illustrating an example quarter wavelength impedance matching distributed transformer.
Figure 8A:
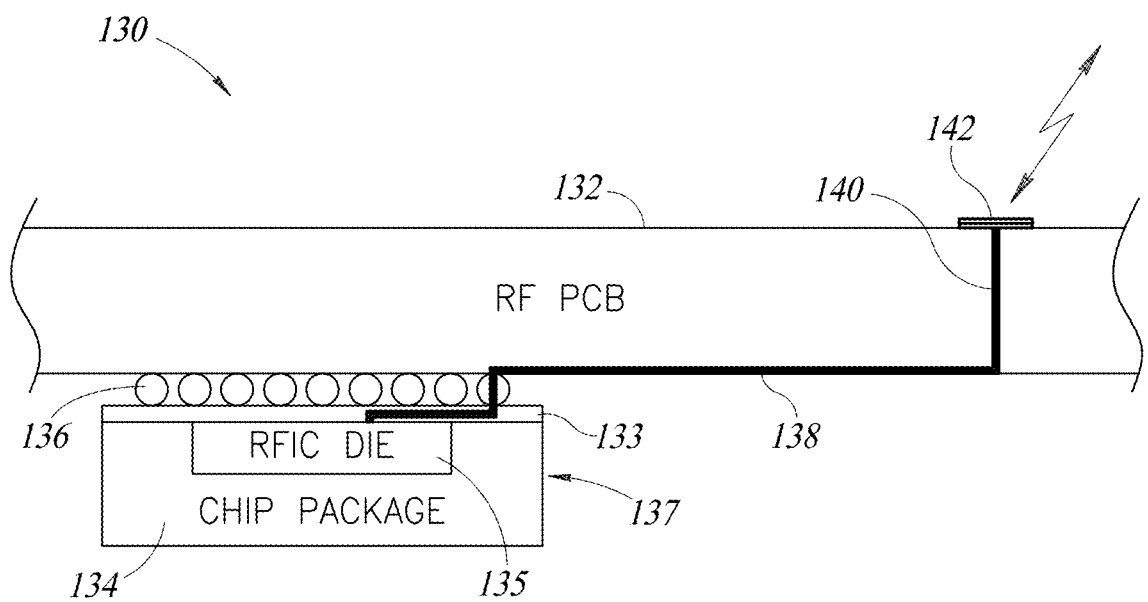
FIG. 8A is a cross section diagram illustrating an example RFIC chip, ball grid array, RF printed circuit board and patch antenna.
Figure 8B:
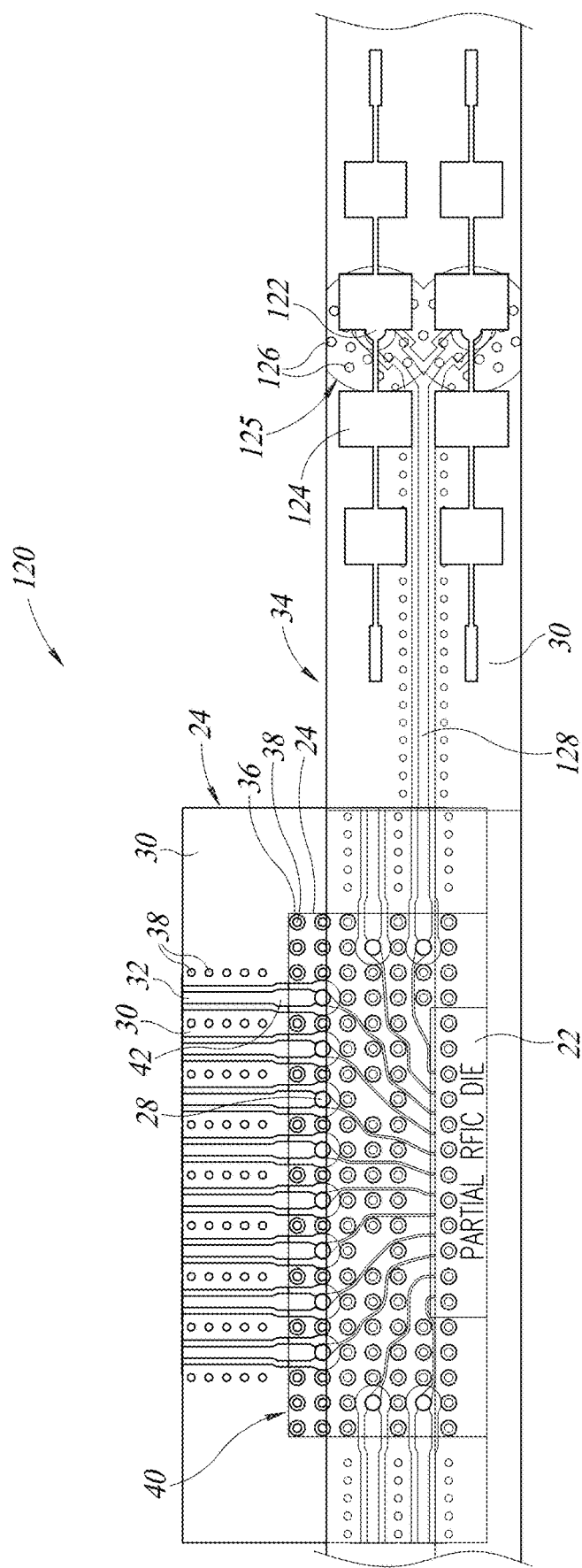
FIG. 8B is a top view diagram illustrating an example RFIC chip including package and redistribution layer, ball grid array, RF printed circuit board and patch antenna.
Figure 8C:
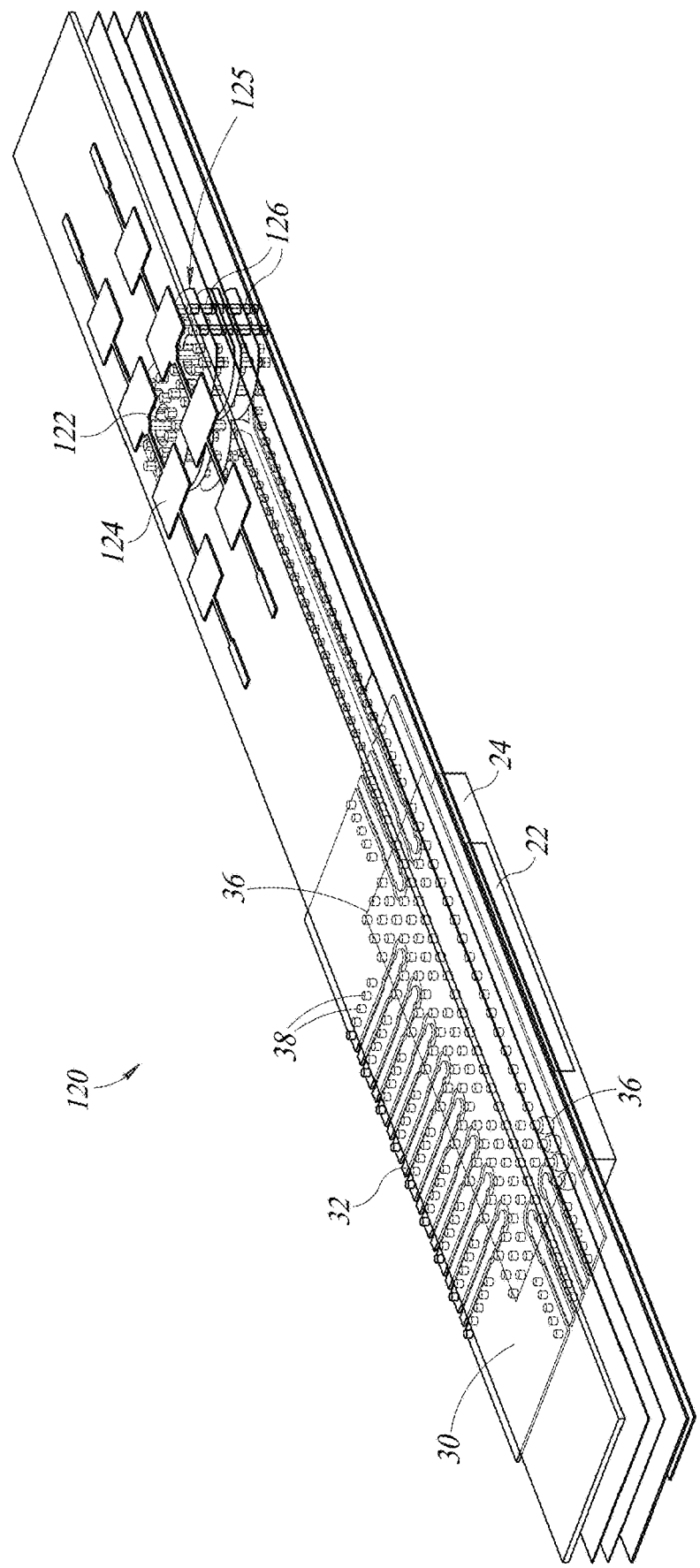
FIG. 8C is a perspective view diagram illustrating an example RFIC chip including die, package and redistribution layer, ball grid array, RF printed circuit board, patch antenna, and coaxial via.

A diagram illustrating an example quarter wavelength impedance matching distributed transformer is shown in FIG. 7. The example structure, generally referenced 110, comprises a grounded coplanar transmission line including signal conductor 32 and ground return 30 separated by an air gap 35. An impedance matching distributed transformer 42 is inline with the signal conductor. High frequency signals from the redistribution layer are transferred to the transmission line via signal solder balls electrically connected to signal transition 28. In one embodiment, the transformer comprises quarter wavelength 45 degree corners 114 in the signal conductor 32 and matching 45 degree quarter wavelength corners in the ground return portion 30. Note that ground vias 116, 118 are skewed compared to the plurality of other ground vias 38. This example transformer is optimized for 80 GHz and exhibits −1.33 dB insertion loss and return loss of −25.52 dB at 80 GHz.

A cross section diagram illustrating an example RFIC chip, ball grid array, RF printed circuit board and patch antenna is shown in FIG. 9A. The example circuit, generally referenced 130, comprises RFIC chip 137 bonded to RF printed circuit board 132. The RFIC chip 137 comprises RFIC die 135, package 134, redistribution layer 133, and ball grid array 136. The RF printed circuit board 132 comprises grounded coplanar transmission line 138, coaxial via 140, and patch antenna 142. High frequency signals from the RFIC die pass through the redistribution layer to the RF printed circuit board 132 via the ball grid array 136 and then to the patch antenna 142 by the transmission line 138 and coaxial via 140.

A top view diagram illustrating an example RFIC chip including package and redistribution layer, ball grid array, RF printed circuit board and patch antenna is shown in FIG. 9B. A perspective view diagram illustrating an example RFIC chip including die, package and redistribution layer, ball grid array, RF printed circuit board, patch antenna, and coaxial via is shown in FIG. 9C.

With reference to FIGS. 9B and 9C, the RFIC structure, generally referenced 120, comprises an RFIC chip bonded to RF printed circuit board 34. The RFIC chip comprises RFIC die 22, package 24, redistribution layer 40, and ball grid array 36. The RF printed circuit board 34 comprises grounded coplanar transmission line including signal conductors 42, impedance matching transformers 42, and ground return 30, coaxial vias 125 including signal via 122 and ground vias 126, and patch antenna 124. High frequency signals from the RFIC die pass through the redistribution layer to the RF printed circuit board 34 via the ball grid array 36 and then to the patch antenna 124 by the transmission line 128 and coaxial via 125. Ground vias 38 electrically couple the ground return 30 to a ground plane on a different layer, e.g., a next layer below the top layer. Note that ground vias in the printed circuit board are located under each ground solder ball. Note also that the patch antennas and grounded coplanar transmission lines are on opposites sides of the printed circuit board 34. It is appreciated that although only two patch antennas are shown for clarity sake, any number of patch antennas and related transmissions lines and vias may be fabricated depending on the particular implementation.

Figure 9:
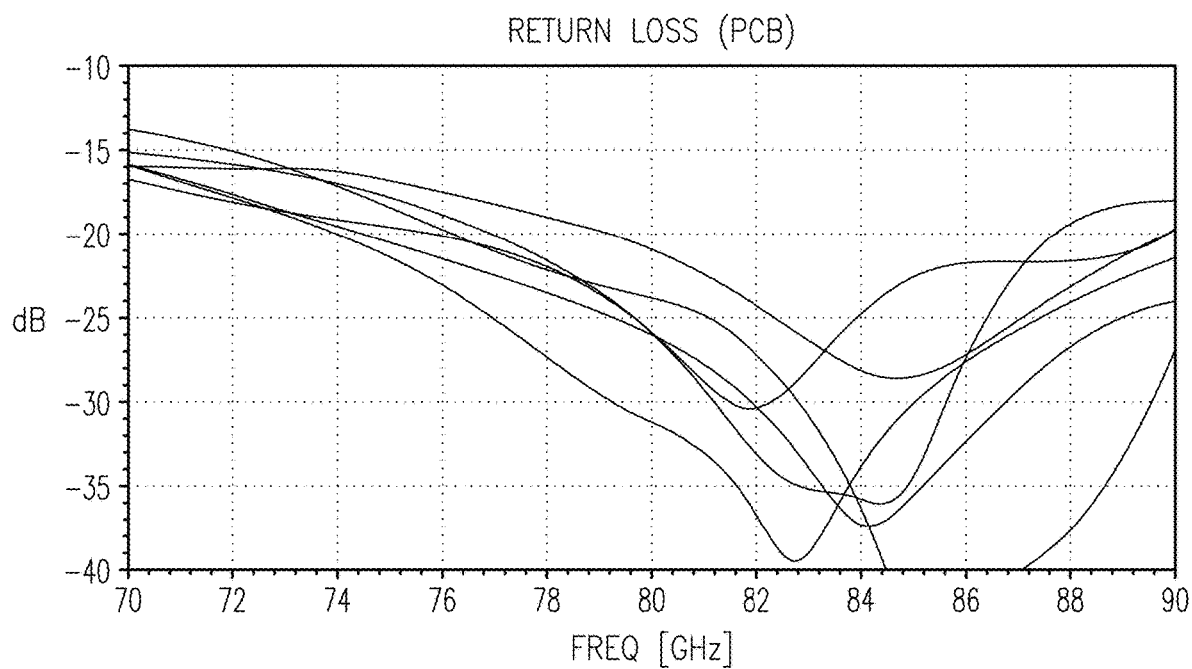
FIG. 9 is a diagram illustrating return loss versus frequency from a perspective of the printed circuit board.

A diagram illustrating return loss versus frequency from a perspective of the printed circuit board is shown in FIG. 9. The traces shown represent simulation results for the path from the antennas to several respective ports on the RFIC die. The return loss varies from approximately −20 dB to less then −30 dB at 80 GHz.

Figure 10:
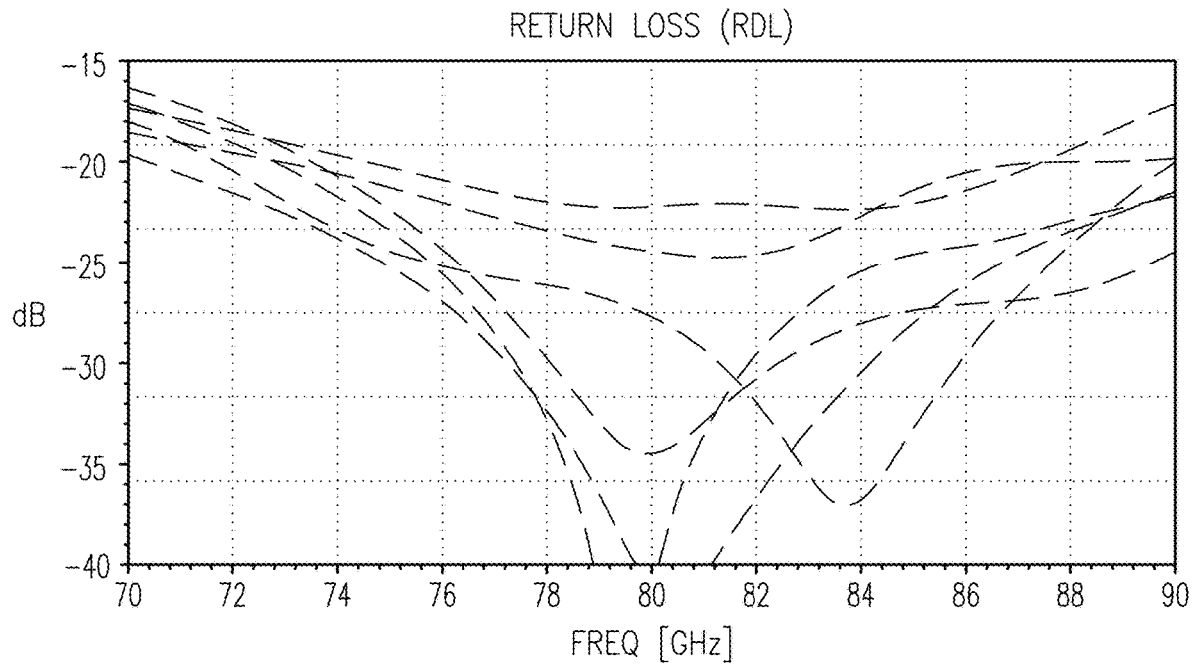
FIG. 10 is a diagram illustrating return loss versus frequency from a perspective of the package redistribution layer.

A diagram illustrating return loss versus frequency from a perspective of the package redistribution layer is shown in FIG. 10. The traces shown represent simulation results for the path from several signal exits on the RFIC die including the copper conductors on the redistribution layer to the printed circuit board towards the antennas. The return loss varies from approximately −22 dB to less then −40 dB at 80 GHz.

Figure 11:
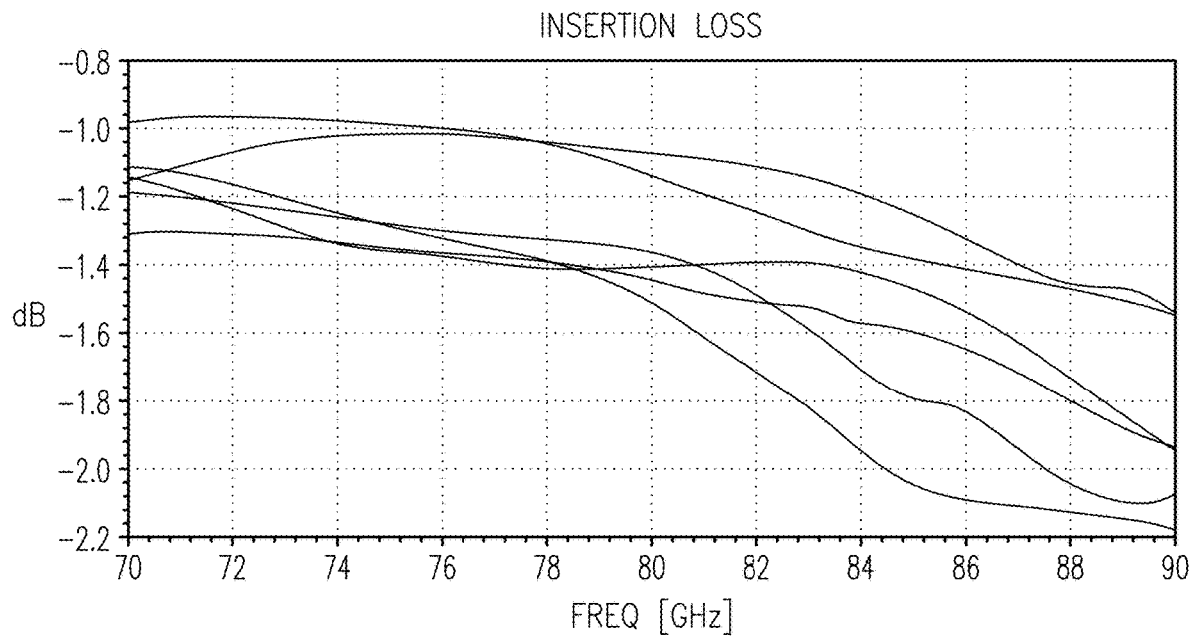
FIG. 11 is a diagram illustrating insertion loss versus frequency for the RFIC package.

A diagram illustrating insertion loss versus frequency for the RFIC package is shown in FIG. 11. For several ports simulated, the insertion loss varies from −1.08 dB to −1.52 dB.

Figure 12:
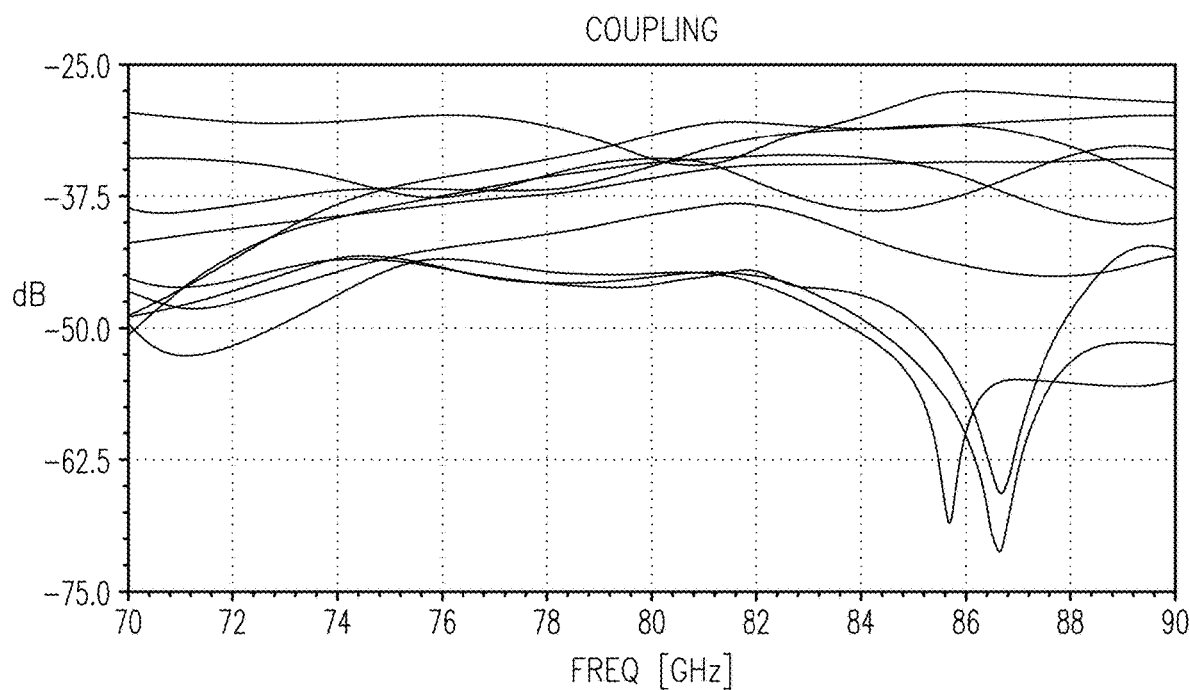
FIG. 12 is a diagram illustrating the coupling versus frequency for the RFIC package.

A diagram illustrating the coupling versus frequency for the RFIC package is shown in FIG. 12. The coupling between ports was simulated as well, with coupling for one example port shown with respect to the other ports. As shown, coupling varies from −31.75 dB to −45.95 dB at 80 GHz.

Figure 13:
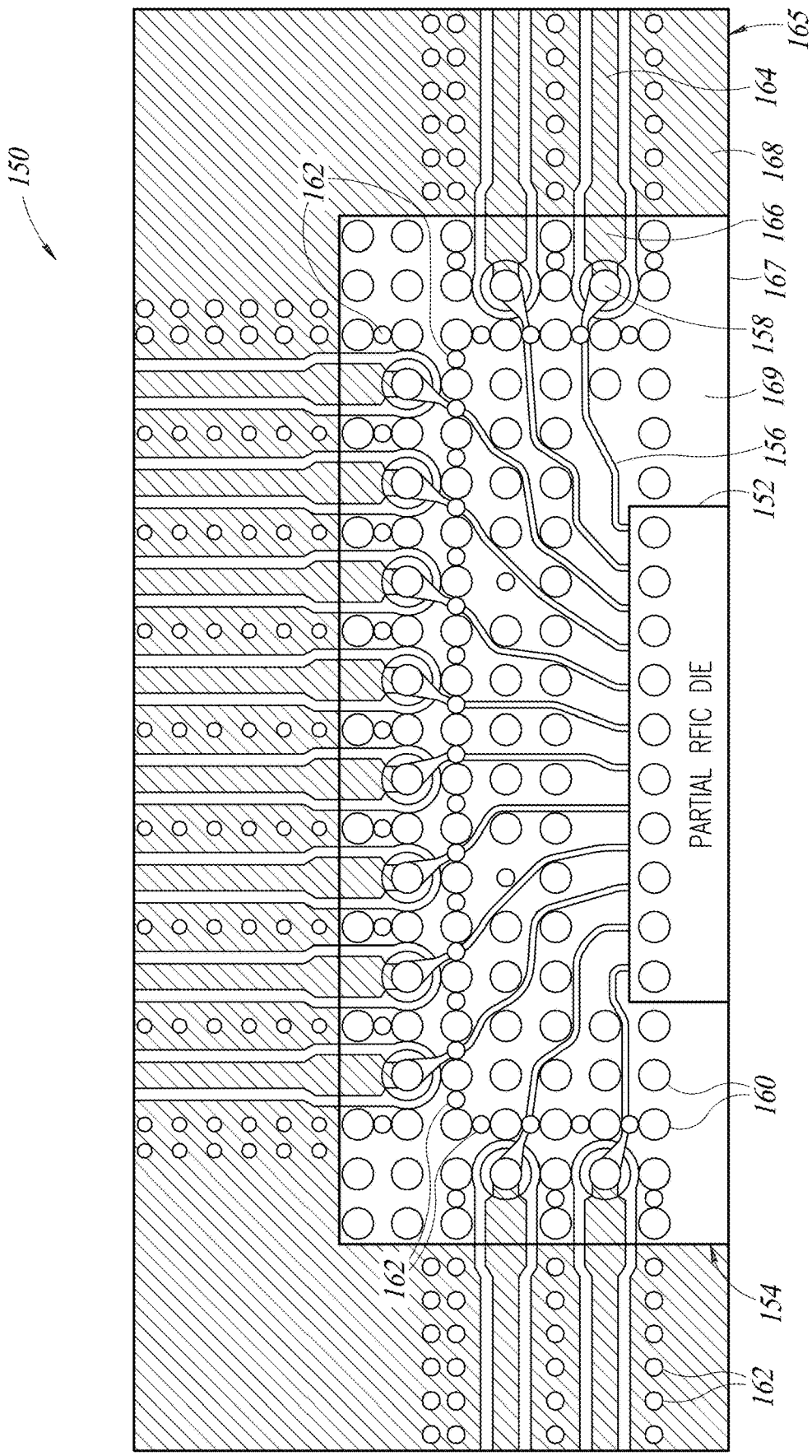
FIG. 13 is a top down diagram illustrating an example RFIC chip including die, package and redistribution layer, ball grid array, RF printed circuit board, and grounded coplanar transmission lines.

A top down diagram illustrating an example RFIC chip including die, package and redistribution layer, ball grid array, RF printed circuit board, and grounded coplanar transmission lines is shown in FIG. 13. The RFIC structure, generally referenced 150, comprises a chip, that includes die 152 molded in package 154, soldered to printed circuit board 165 via a ball grid array (BGA) 160. The signal lines 156 connect the high frequency output signals from the die 152 (TX for example) to signal solder balls 158 to the printed circuit board 165 at transitions. The signals travel along coplanar transmission lines 156 that are part of a redistribution layer (RDL) 167 fabricated on the bottom surface of the package 154. A solid or mesh ground return 169 surrounds each signal trace 156 and covers most of the surface of the package RDL. The package provides fan out of the signals and facilitates connections of the signal lines to the printed circuit board.

The signal solder balls are soldered to the printed circuit board at one end of grounded coplanar transmission lines (including signal conductors 164 and ground return 168) that extend from the signal solder balls 158 to coaxial vias (not shown) connected to patch antennas (not shown) printed on the other side of the printed circuit board 165. Each grounded coplanar transmission line includes a distributed impedance matching quarter wavelength transformer 166. Note that without the transformer there would be an impedance mismatch between the RDL in the package and the printed circuit board. In addition, each signal conductor 164 is surrounded by a solid or mesh ground return 168 separated by an air gap 163. A plurality of ground vias 162 couple the ground return areas 168 to a ground plane layer below the top layer. Note that in this example embodiment, none of the ground vias 162 are located under ground solder balls that electrically connect the ground return 169 on the redistribution layer 167 of the package 154 to the ground return 168 on the printed circuit board. The ground vias electrically connect the ground return 168 to a ground plane on, for example, a second layer of the printed circuit board 165. Note that in this embodiment, there are fewer ground vias under the package RDL, surrounding the ground solder balls mainly in the first two rows from the edge of the package.

Figure 14:
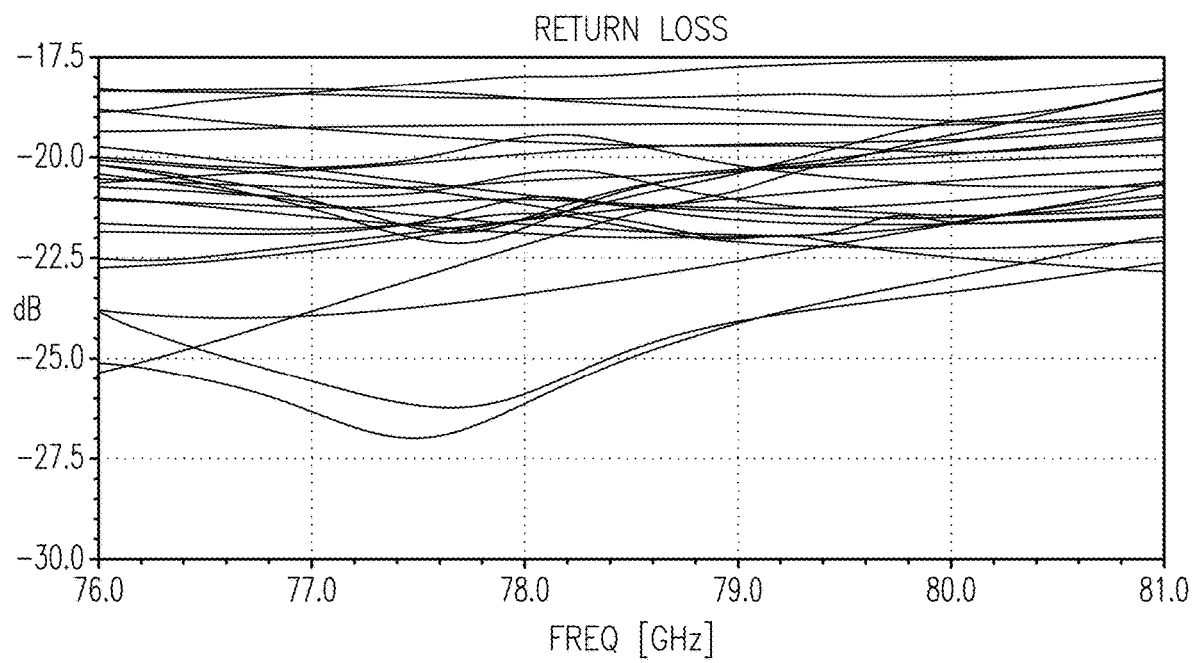
FIG. 14 is a diagram illustrating return loss versus frequency for the RFIC structure of FIG. 13.

A diagram illustrating return loss versus frequency for the RFIC structure of FIG. 13 is shown in FIG. 14. The simulated return loss for several ports varies from approximately −17.50 dB to −23.80 dB at 80 GHz.

Figure 15:
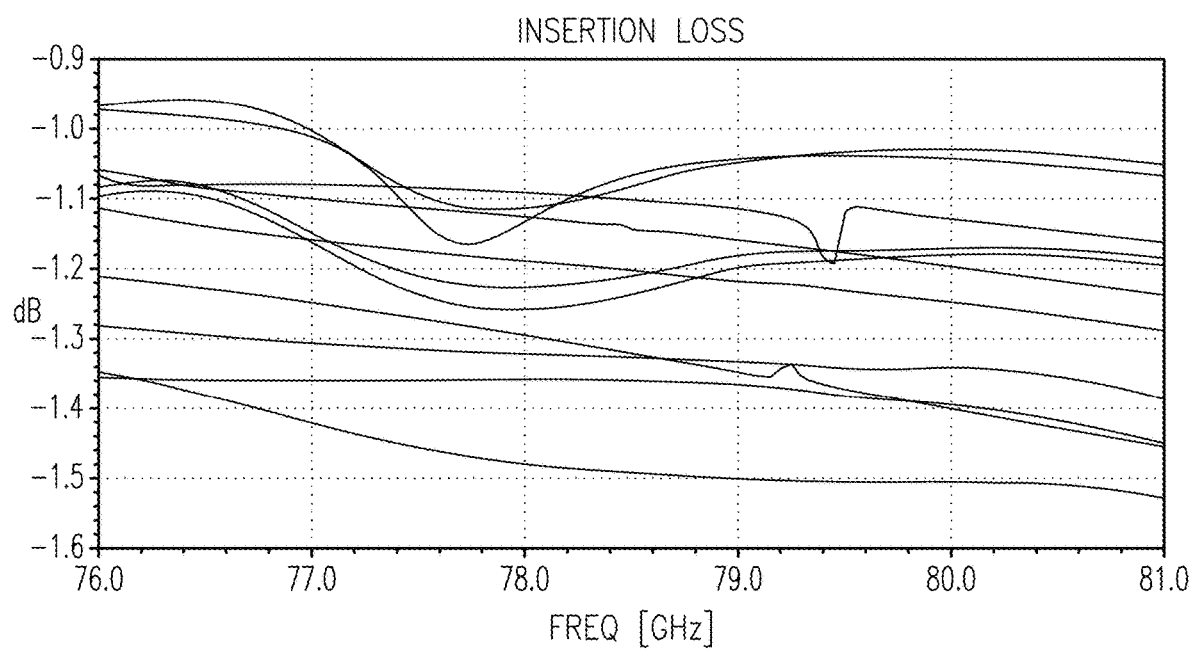
FIG. 15 is a diagram illustrating insertion loss versus frequency for the RFIC structure of FIG. 13.

A diagram illustrating insertion loss versus frequency for the RFIC structure of FIG. 13 is shown in FIG. 15. The simulated insertion loss for several ports varies from approximately −1.05 dB to −1.52 dB at 80 GHz.

Figure 16:
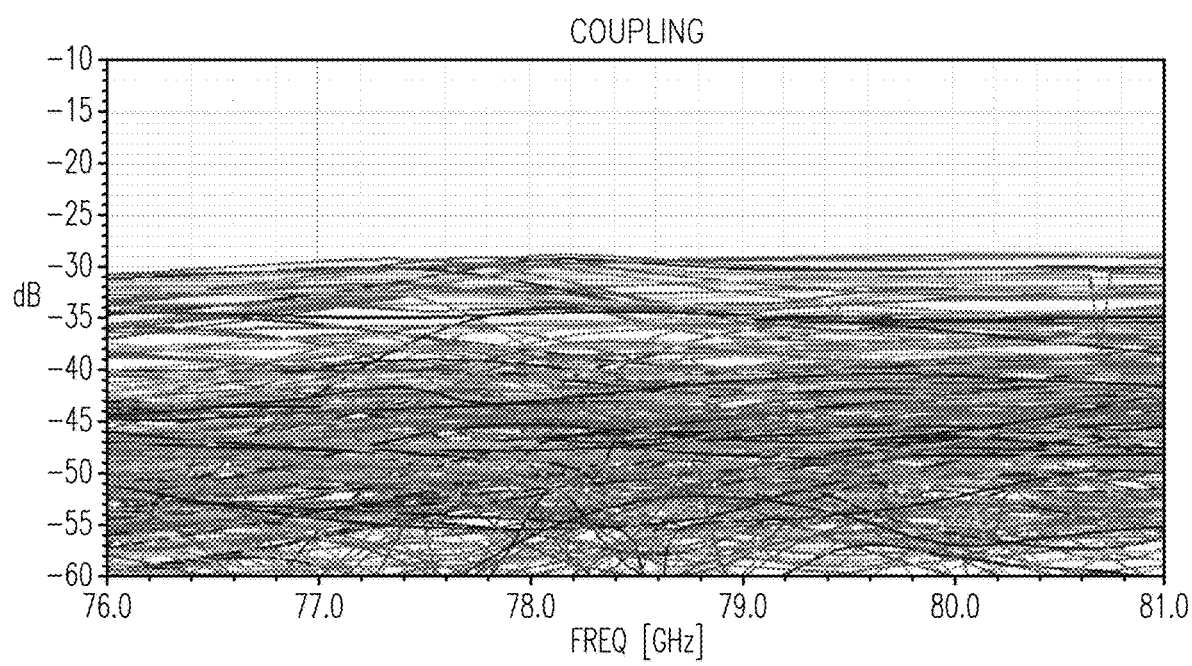
FIG. 16 is a diagram illustrating the coupling versus frequency for the RFIC structure of FIG. 13.

A diagram illustrating the coupling versus frequency for the RFIC structure of FIG. 13 is shown in FIG. 16. The simulated couplings for all combinations of ports are all below approximately −29 dB.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A radio frequency integrated circuit (RFIC) structure, comprising:
   an integrated circuit die incorporating radio frequency (RF) circuitry and a plurality of RF output signals;
   a package molded around and encapsulating said integrated circuit die;

a single redistribution layer fabricated on a surface of said package, said integrated circuit die electrically coupled to said single redistribution layer, said redistribution layer operative to be mounted on and electrically coupled to a printed circuit board via a plurality of solder ball transitions in a ball grid array;

a plurality of coplanar RF transmission lines fabricated on said single redistribution layer operative to conduct said plurality of RF output signals from said integrated circuit die to a first side of said printed circuit board via signal solder ball transitions, wherein each coplanar RF transmission line comprises a funnel shape portion leading to a respective signal solder ball;

a conductive ground shield fabricated on said single redistribution layer and operative to shield said plurality of coplanar RF transmission lines, said ground shield electrically connected to a ground plane on said printed circuit board via a plurality of ground solder balls; and wherein said plurality of ground solder balls surround said plurality of coplanar RF transmission lines and said signal solder ball transitions, and are operative to couple said ground shield to said ground plane on said printed circuit board and provide an electrical return path for said plurality of coplanar RF transmission lines.

2. The RFIC structure according to claim 1, wherein said first side of said printed circuit board comprises grounded coplanar transmission lines electrically connecting said RF output signals said signal solder ball transitions to patch antennas fabricated on a second side of said printed circuit board.

3. The RFIC structure according to claim 2, further comprising a plurality of coaxial vias, each coaxial via electrically connecting a grounded coplanar transmission line on said first side of said printed circuit board to a respective patch antenna on said second side of said printed circuit board, said coaxial via including a center signal via surrounded by a plurality of ground vias.

4. The RFIC structure according to claim 2, wherein said grounded coplanar transmission lines comprise a ground return plane on said first side of said printed circuit board electrically connected to a ground reference plane on said second side of said printed circuit board by a plurality of ground vias.

5. The RFIC structure according to claim 2, wherein a portion of said ground vias lie under said plurality of ground solder balls.

6. The RFIC structure according to claim 2, wherein none of said ground vias lie under said plurality of ground solder balls.

7. The RFIC structure according to claim 1, wherein said ground solder balls function as a transmission line ground balance.

8. The RFIC structure according to claim 1, wherein said grounded coplanar transmission lines comprise an impedance matching quarter wavelength distributed transformer electrically coupled thereto.

9. The RFIC structure according to claim 1, wherein a pitch between said solder ball transitions is 0.5 mm.

10. The RFIC structure according to claim 1, wherein each signal solder ball is surrounded by said ground shield from all sides by an air gap having a diameter that is optimal for minimizing electromagnetic radiation leaks to other channels.

11. A radio frequency integrated circuit (RFIC) structure, comprising:

an integrated circuit die incorporating radio frequency (RF) circuitry and a plurality of RF output signals;

a package molded around and encapsulating said integrated circuit die;

a single redistribution layer fabricated on a surface of said package, said integrated circuit die electrically coupled to said single redistribution layer, said redistribution layer operative to be mounted on and electrically coupled to a printed circuit board via a plurality of solder ball transitions in a ball grid array;

a plurality of coplanar RF transmission lines fabricated on said single redistribution layer operative to conduct said plurality of RF output signals from said integrated circuit die to a first side of said printed circuit board via signal solder ball transitions;

a conductive ground shield fabricated on said single redistribution layer and operative to shield said plurality of coplanar RF transmission lines, said ground shield electrically connected to a ground plane on said printed circuit board via a plurality of ground solder balls;

wherein said plurality of ground solder balls surround said plurality of coplanar RF transmission lines and said signal solder ball transitions, and are operative to couple said ground shield to said ground plane on said printed circuit board and provide an electrical return path for said plurality of coplanar RF transmission line;

a plurality of grounded coplanar transmission lines fabricated on a first side of said printed circuit board electrically connecting said RF output signals from said signal solder ball transitions to patch antennas fabricated on a second side of said printed circuit board; and a plurality of ground vias electrically connecting a ground return plane on said first side of said printed circuit board to a ground reference plane on said second side of said printed circuit board including under said ground solder balls.

12. The RFIC structure according to claim 11, further comprising a plurality of coaxial vias, each coaxial via electrically connecting a grounded coplanar transmission line on said first side of said printed circuit board to a respective patch antenna on said second side of said printed circuit board, said coaxial via including a center signal via surrounded by a plurality of ground vias.

13. The RFIC structure according to claim 11, wherein said grounded coplanar transmission lines comprise an impedance matching quarter wavelength distributed transformer electrically coupled thereto.

14. The RFIC structure according to claim 11, wherein a pitch between said solder ball transitions and ground vias is 0.5 mm.

15. The RFIC structure according to claim 11, wherein each coplanar RF transmission line comprises a funnel shape portion leading to a respective signal solder ball.

16. The RFIC structure according to claim 11, wherein each signal solder ball is surrounded by said ground shield from all sides by an air gap having a diameter that is optimal for minimizing electromagnetic radiation leaks to other channels.

17. A radio frequency integrated circuit (RFIC) structure, comprising:

an integrated circuit die incorporating radio frequency (RF) circuitry and a plurality of RF output signals;

a package molded around and encapsulating said integrated circuit die;

a single redistribution layer fabricated on a surface of said package, said integrated circuit die electrically coupled to said single redistribution layer, said redistribution layer operative to be mounted on and electrically coupled to a printed circuit board via a plurality of solder ball transitions in a ball grid array;

a plurality of coplanar RF transmission lines fabricated on said single redistribution layer operative to conduct said plurality of RF output signals from said integrated circuit die to a first side of said printed circuit board via signal solder ball transitions;

a conductive ground shield fabricated on said single redistribution layer and operative to shield said plurality of coplanar RF transmission lines, said ground shield electrically connected to a ground plane on said printed circuit board via a plurality of ground solder balls;

wherein said plurality of ground solder balls surround said plurality of coplanar RF transmission lines and said signal solder ball transitions, and are operative to couple said ground shield to said ground plane on said printed circuit board and provide an electrical return path for said plurality of coplanar RF transmission line;

a plurality of grounded coplanar transmission lines fabricated on a first side of said printed circuit board electrically connecting said RF output signals from said signal solder ball transitions to patch antennas fabricated on a second side of said printed circuit board; and a plurality of ground vias electrically connecting a ground return plane on said first side of said printed circuit board to a ground reference plane on said second side of said printed circuit board including surrounding said signal solder ball transitions but not under said ground solder balls.

18. The RFIC structure according to claim 17, further comprising a plurality of coaxial vias, each coaxial via electrically connecting a grounded coplanar transmission line on said first side of said printed circuit board to a respective patch antenna on said second side of said printed circuit board, said coaxial via including a center signal via surrounded by a plurality of ground vias.

19. The RFIC structure according to claim 17, wherein said grounded coplanar transmission lines comprise an impedance matching quarter wavelength distributed transformer electrically coupled thereto.

20. The RFIC structure according to claim 17, wherein a pitch between said solder ball transitions and ground vias is 0.5 mm.

21. The RFIC structure according to claim 17, wherein each coplanar RF transmission line comprises a funnel shape portion leading to a respective signal solder ball.

22. The RFIC structure according to claim 17, wherein each signal solder ball is surrounded by said ground shield from all sides by an air gap having a diameter that is optimal for minimizing electromagnetic radiation leaks to other channels.

* * * * *